United States Patent
Gaddam et al.

(10) Patent No.: US 10,015,896 B2
(45) Date of Patent: Jul. 3, 2018

(54) VENTILATED ELECTRONIC DISPLAY ENCLOSURE

(71) Applicant: Daktronics, Inc., Brookings, SD (US)

(72) Inventors: Sunil Gaddam, Dell Rapids, SD (US); Wayne R. Tucker, Volga, SD (US); Travis Whitehead, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 577 days.

(21) Appl. No.: 14/635,224

(22) Filed: Mar. 2, 2015

(65) Prior Publication Data

US 2015/0250067 A1 Sep. 3, 2015

Related U.S. Application Data

(60) Provisional application No. 61/947,142, filed on Mar. 3, 2014.

(51) Int. Cl.
- *H05K 5/00* (2006.01)
- *H05K 5/02* (2006.01)
- *H05K 7/20* (2006.01)

(52) U.S. Cl.
CPC ....... *H05K 5/0213* (2013.01); *H05K 7/20145* (2013.01); *H05K 7/20954* (2013.01); *Y10T 29/49826* (2015.01)

(58) Field of Classification Search
CPC ........... H05K 7/20854; H05K 7/20145; H05K 7/20136; H05K 7/20954; H05K 5/20972; H05K 5/0213; H05K 5/0004
See application file for complete search history.

(56) References Cited

U.S. PATENT DOCUMENTS

| | | | | |
|---|---|---|---|---|
| 7,995,342 B2 * | 8/2011 | Nakamichi | ....... | G02F 1/133308 361/695 |
| 8,016,452 B2 * | 9/2011 | Dunn | ....... | G09F 9/33 362/240 |
| 8,274,622 B2 * | 9/2012 | Dunn | ....... | H05K 7/20972 349/161 |
| 8,693,185 B2 * | 4/2014 | Dunn | ....... | G02F 1/133385 165/80.3 |
| 8,717,751 B2 * | 5/2014 | Marker | ....... | H05K 5/0004 361/679.01 |
| 9,282,676 B1 * | 3/2016 | Diaz | ....... | F16M 11/00 |

(Continued)

FOREIGN PATENT DOCUMENTS

KR 20150006124 A * 1/2015 ......... H05K 7/20145

*Primary Examiner* — Steven B McAllister
*Assistant Examiner* — Jonathan Cotov
(74) *Attorney, Agent, or Firm* — Schwegman Lundberg & Woessner, P.A.

(57) ABSTRACT

A display enclosure assembly comprises a cabinet enclosing an interior space, the cabinet comprising a front wall and a rear wall, one or more display modules at least partially enclosed within the interior space, the one or more display modules configured to form an electronic display at the front wall, one or more fans mounted at the rear wall, each of the one or more fans comprising a fan intake facing rearward from the rear wall and a fan exhaust facing into the interior space, a vent extending at least partially between the front wall and the rear wall, the vent providing a first pathway for cooling air to pass from a front side of the cabinet to a rear side of the cabinet, and an exhaust providing a second pathway for warmed air to exit the interior space.

18 Claims, 5 Drawing Sheets

(56) References Cited

U.S. PATENT DOCUMENTS

| | | | | |
|---|---|---|---|---|
| 9,414,516 B2* | 8/2016 | Chin | ................... | H05K 7/20145 |
| 2004/0123501 A1* | 7/2004 | Safavi | ....................... | G09F 9/33 40/452 |
| 2008/0236005 A1* | 10/2008 | Isayev | ..................... | G09F 13/04 40/574 |
| 2009/0015997 A1* | 1/2009 | Barajas | ................... | G09F 13/22 361/679.27 |
| 2009/0231808 A1* | 9/2009 | Burgner | ............. | H05K 7/20972 361/695 |
| 2009/0244472 A1* | 10/2009 | Dunn | ................ | G02F 1/133385 349/161 |
| 2009/0310059 A1* | 12/2009 | Kim | .................. | G02F 1/133385 349/58 |
| 2011/0051071 A1* | 3/2011 | Nakamichi | ............ | G06F 1/1601 349/161 |
| 2011/0085302 A1* | 4/2011 | Nakamichi | ........ | H05K 7/20972 361/695 |
| 2011/0162831 A1* | 7/2011 | Lee | .................... | H05K 7/20972 165/287 |
| 2011/0167845 A1* | 7/2011 | Lee | .................... | H05K 7/20972 62/89 |
| 2012/0255721 A1* | 10/2012 | Kim | .................. | G02F 1/133382 165/288 |
| 2013/0171921 A1* | 7/2013 | Nakamichi | ........ | H05K 7/20972 454/184 |
| 2014/0268562 A1* | 9/2014 | Cox | ................... | H05K 7/20963 361/692 |
| 2014/0321055 A1* | 10/2014 | Yoon | .................. | H05K 7/20136 361/697 |
| 2014/0334100 A1* | 11/2014 | Yoon | .................. | H05K 7/20145 361/692 |
| 2015/0003859 A1* | 1/2015 | Tanida | ................ | G03G 21/206 399/92 |
| 2015/0237761 A1* | 8/2015 | Dunn | ................. | H05K 7/20154 362/97.3 |

* cited by examiner

US 10,015,896 B2

VENTILATED ELECTRONIC DISPLAY ENCLOSURE

CLAIM OF PRIORITY

This application claims the benefit of priority of U.S. Provisional Patent Application Ser. No. 61/947,142, filed on Mar. 3, 2014, the benefit of priority of which is claimed hereby, and which is incorporated by reference herein in its entirety.

BACKGROUND

Electronic display signs, such as can be used for business signs and the like, can include a plurality of light-emitting elements, such as light-emitting diodes (LEDs), arranged in a grid array. The electronic display signs can include supporting electronics in order to operate the light-emitting elements of the sign, such as a circuit board including light-emitting element controllers and drivers. The supporting electronics typically generate heat, such that it can be desirable to cool the LEDs and supporting electronics, such as via ventilation.

Electronic display signs are becoming more and more popular for businesses. The light-emitting elements can provide for easier and more rapid control of the information being displayed on the electronic display sign over more traditional physical signs, which were either completely static or could be modified only by manual adjustment of the sign in order to change the sign content. As electronic display signs become more popular, businesses often choose to upgrade an existing physical signs to an electronic display sign. Existing physical signs can have a fixed geometry that can require precise retrofitting in order to provide a visually appealing electronic display sign within the existing physical sign structure. The fixed geometry can also make it difficult to provide adequate ventilation for the electronic display sign.

SUMMARY

The present disclosure describes a display enclosure assembly, for example for an electronic display sign, that can provide for ventilation for cooling of one or more display modules that form the electronic display of the electronic display sign. The display enclosure assembly can allow an existing sign structure to be retrofitted for conversion to an electronic display sign, while still providing for adequate ventilation of the display modules.

In an example, the present disclosure describes a display enclosure assembly comprising a cabinet enclosing an interior space, the cabinet comprising a front wall and a rear wall, one or more display modules at least partially enclosed within the interior space, the one or more display modules configured to form an electronic display at the front wall, one or more fans mounted at the rear wall, each of the one or more fans comprising a fan intake facing rearward from the rear wall and a fan exhaust facing into the interior space, a vent extending at least partially between the front wall and the rear wall, the vent providing a first pathway for cooling air to pass from a front side of the cabinet to arear side of the cabinet, and an exhaust providing a second pathway for warmed air to exit the interior space.

In another example, the present disclosure describes an electronic sign comprising, a sign structure and one or more display enclosure assemblies mounted to the sign structure, wherein the sign structure and the one or more display enclosure assemblies define a sign exterior and a sign interior space. Each of the one or more display enclosure assemblies includes a cabinet located at least partially in the sign interior space, the cabinet enclosing a cabinet interior space and comprising a front wall and a rear wall, one or more display modules at least partially enclosed within the cabinet interior space, the one or more display modules configured to form an electronic display at the front wall of the cabinet, one or more fans mounted at the rear wall of the cabinet, each of the one or more fans comprising a fan intake facing rearward into the sign interior space and a fan exhaust facing into the cabinet interior space, a vent extending at least partially between the front wall and the rear wall, the vent providing a first pathway for cooling air to pass from the sign exterior to the sign interior space, and an exhaust providing a second pathway for warmed air to pass from the cabinet interior space to the sign exterior.

In yet another example, the present disclosure describes a method comprising the steps of providing or receiving one or more display enclosure assemblies each comprising a cabinet enclosing a cabinet interior space, the cabinet comprising a front wall and a rear wall, one or more display modules at least partially enclosed within the cabinet interior space, the one or more display modules configured to form an electronic display at the front wall of the cabinet, one or more fans mounted at the rear wall of the cabinet, each of the one or more fans comprising a fan intake facing rearward into the sign interior space and a fan exhaust facing into the cabinet interior space, a vent extending at least partially between the front wall and the rear wall, and an exhaust in fluid communication with the cabinet interior space. The method further comprises mounting the one or more display enclosure assemblies to a sign structure so that the sign structure and the one or more display enclosure assemblies define a sign exterior and a sign interior space and so that the vent provides a first pathway for cooling air to pass from the sign exterior to the sign interior space and so that the exhaust provides a second pathway for warmed air to pass from the cabinet interior space to the sign exterior.

These and other examples and features of the present systems and methods will be set forth in part in the following Detailed Description. This Summary is intended to provide an overview of the present subject matter, and is not intended to provide an exclusive or exhaustive explanation. The Detailed Description below is included to provide further information about the present systems and methods.

DETAILED DESCRIPTION

In the following Detailed Description, reference is made to the accompanying drawings which form a part hereof. The drawings show, by way of illustration, specific examples in which the present sign structure configurations can be practiced. These examples are described in sufficient detail to enable those skilled in the art to practice, and it is to be understood that other embodiments can be utilized and that structural changes can be made without departing from the scope of the present disclosure. Therefore, the following Detailed Description is not to be taken in a limiting sense, and the scope of the present disclosure is defined by the appended claims and their equivalents.

This disclosure describes a display enclosure assembly, for example for an electronic display sign. The configuration of the display enclosure assembly can provide for installation of the display enclosure assembly into a sign structure to provide an electronic display sign, for example for use as a business sign. The display enclosure assemblies described in the present disclosure can provide for relatively easy installation of the display enclosure into an existing sign structure, for example to allow for conversion of the existing sign from a physical sign to an electronic display sign. The display enclosure assembly can provide for ventilation of the one or more display modules that can comprise the electronic display, and, in particular, can provide for ventilation of the electronic display with minimal modification of the existing sign.

Figure 1:
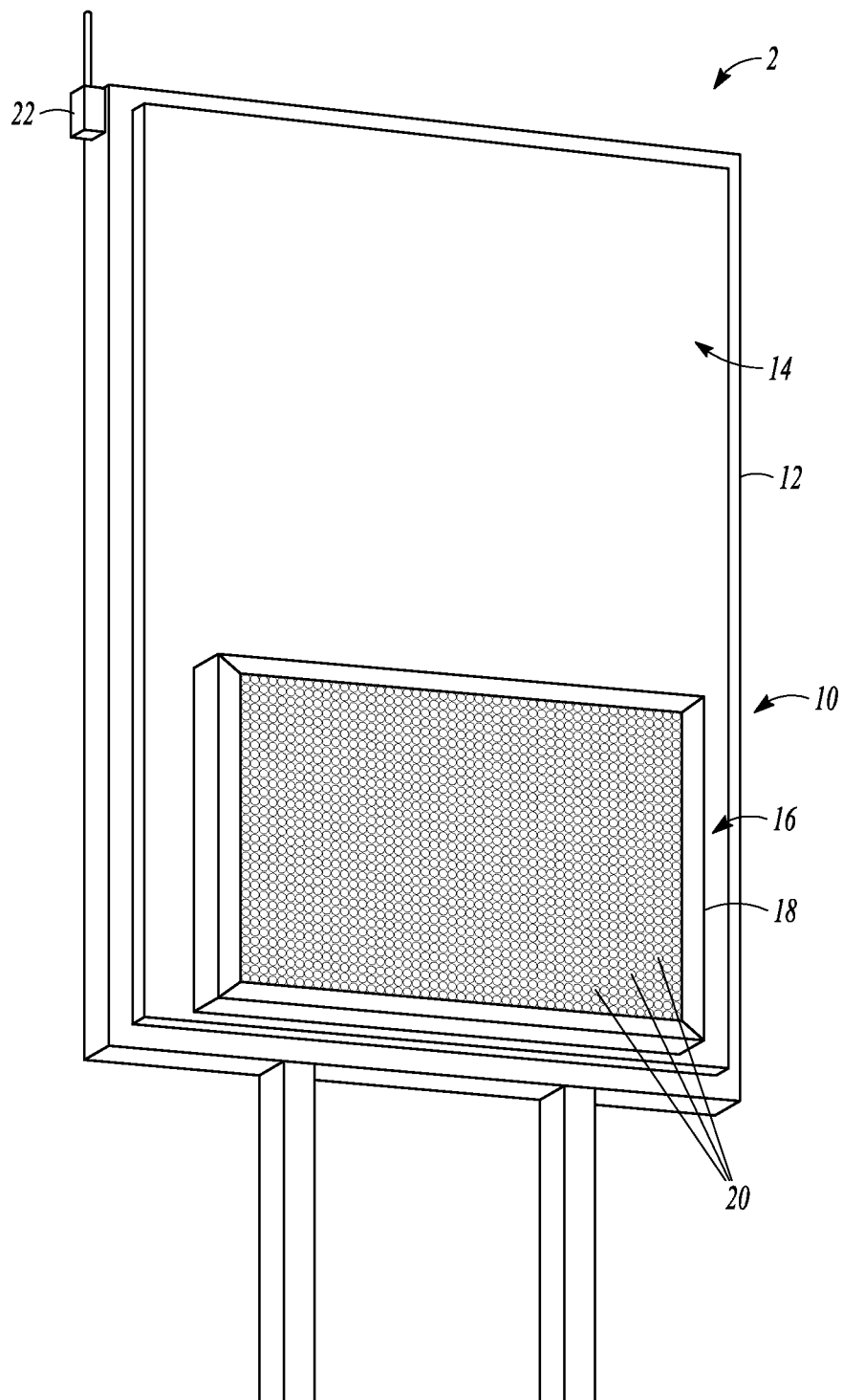
FIG. 1 is a perspective view of an example sign structure that includes an electronic display sign.

FIG. 1 shows a perspective view of an example sign structure 2 comprising an electronic display sign 10. The sign structure 2 can comprise an outer frame 12 that can support and at least partially enclose the electronic display sign 10. The outer frame 12 can also provide a display area 14 for a permanent physical sign, for example to display a logo of the business. The electronic display sign 10 can provide for dynamic informational display, e.g., for display of information that can be changed if and when a user wishes to do so. The ability to dynamically change the information displayed on the electronic display sign 10 can provide a user with considerable flexibility to provide information to potential customers, such as pricing, specials, or other information regarding the business.

The electronic display sign 10 can comprise one or more display modules (described in more detail below) that form a substantially unitary electronic display 16 at a front face of the electronic display sign 10. For example, the one or more display modules can be mounted in a cabinet 18 of the electronic display 16, which in turn can be mounted in the outer frame 12. When the electronic display 16 comprises a plurality of display modules, the display modules can be positioned so that the electronic display 16 appears as a single, unitary display when viewed by an observer. The number and positioning of the one or more display modules can depend on the desired size of the electronic display 16.

The electronic display 16 can be formed from one or more modules each comprising a plurality of individual light-emitting element pixels 20. The light-emitting element pixels 20 can be arranged in a grid-like array. In an example, the light-emitting element pixels 20 can comprise light-emitting diode (LED) devices, although other types of light-emitting devices can be used. For the sake of brevity, the remainder of this disclosure will describe the light-emitting elements as LEDs, for example by referring to the light-emitting element pixels 20 as LED pixels 20. However, a person of skill in the art will understand that the term "LED" as used herein, can include any type of practical light-emitting device, including, but not limited to, light-emitting diodes (LEDs), organic light-emitting diodes (OLEDs), organic light-emitting transistors (OLETs), surface-conduction electron-emitter display devices (SEDs), field-emission display devices (FEDs), laser TV quantum dot liquid crystal display devices, quantum dot display devices (QD-LED), ferro-liquid display devices (FLDs), liquid crystal display devices (LCDs), or thick-film dielectric electroluminescent devices (TDELs).

The LED pixels 20 can be configured as monochrome pixels, e.g., with each LED pixel 20 comprising an LED of the same color (such as red, amber, white, or the like), multi-color pixels, e.g., with each LED pixel 20 comprises two or more discrete color options, where each pixel can comprise more than one color, but the number of color options are limited (usually to two or three specific colors), or full-color pixels, e.g., with each LED pixel 20 comprising three or more individual LEDs grouped in close proximity, where essentially any color can be selected for each pixel by combining the colors of one or more of the LEDs in each LED pixel 20. In an example, full-color LED pixels 20 can each comprise a red LED, a green LED, and a blue LED or one surface mount LED that can generate any or all three colors. The red, green, and blue LEDs can cooperate to provide a spectrum of colors when one, two, or three of the light emitting elements in a pixel are lit at varying intensities. The front face of the electronic display 16 can be configured to provide a black or empty looking surface over a portion of the display, when desired, by deactivating or turning off the LEDs in a particular portion of the electronic display 16.

The electronic display sign 10 can be controlled remotely, such as by being connected to a radio communication device, such as an antenna 22. The antenna 22 or other radio communication device can allow the content of the sign to be updated remotely. For example, a remote computer can be configured to allow for control of the electronic display sign 10, such as by being loaded with software for controlling the electronic display sign 10. The remote computer can communicate with the electronic display sign 10 through a wireless communication link, such as a wireless network (e.g., a WiFi communication link or a wireless data link, such as a CDMA, EDGE, HSPA, EVDO, LTE, WIMAX, UMTS, HSPA, and the like) via the antenna 22.

As noted above, in an example, the sign structure 2 can have been an existing physical business sign that has been retrofitted to include the electronic display sign 10 in the sign structure 2. For example, the sign structure 2 can previously have an area for a static message copyboard, which can comprise a face, such as a polycarbonate face, on one or both sides of the sign structure 2, for the placement of static sign elements, such as changeable plastic letters placed in one or more letter tracks. The area for the static sign elements can be removed from the outer frame 12, and the area can be replaced with the electronic display sign 10. Because the sign structure 2 can be an existing sign that is being retrofitted, the electronic display sign 10 may need to provide all structures necessary for operation of the electronic display 16, including the structure or structures that will provide for cooling of the display modules during operation. In addition, modification of the existing outer frame 12 is preferably kept to a minimum so that the business owner need not replace the entire sign structure 2. As described in more detail below, the electronic display sign 10 can be configured to fit within as small of a space as is practical to minimize or reduce the amount of the outer frame 12 that has to be altered in order to accommodate the electronic display sign 10, while still providing for adequate ventilation of the electronic display sign 10.

Figure 2:
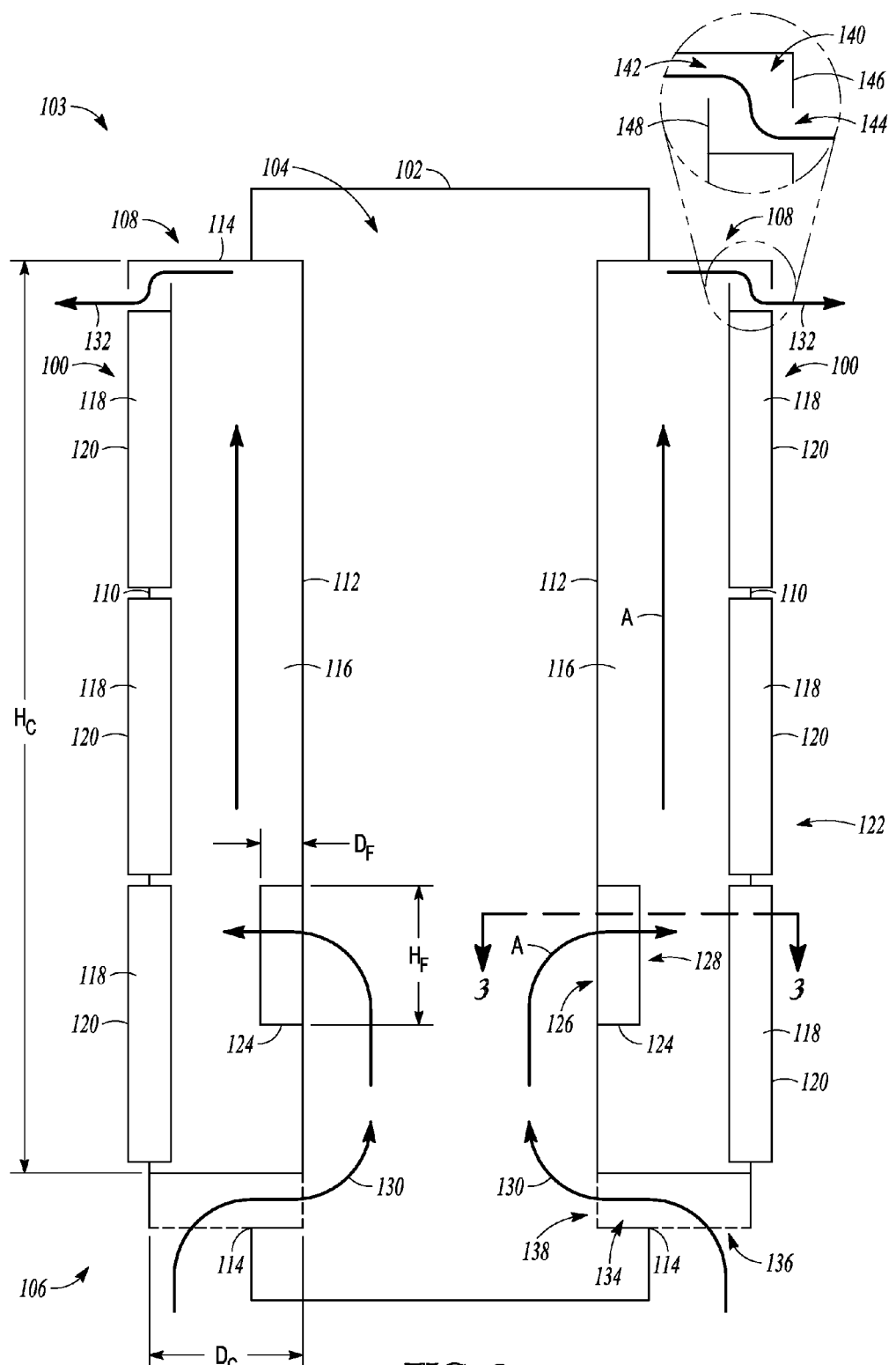
FIG. 2 is a cross-sectional side view of an example sign structure showing a first example ventilation configuration.
Figure 3:
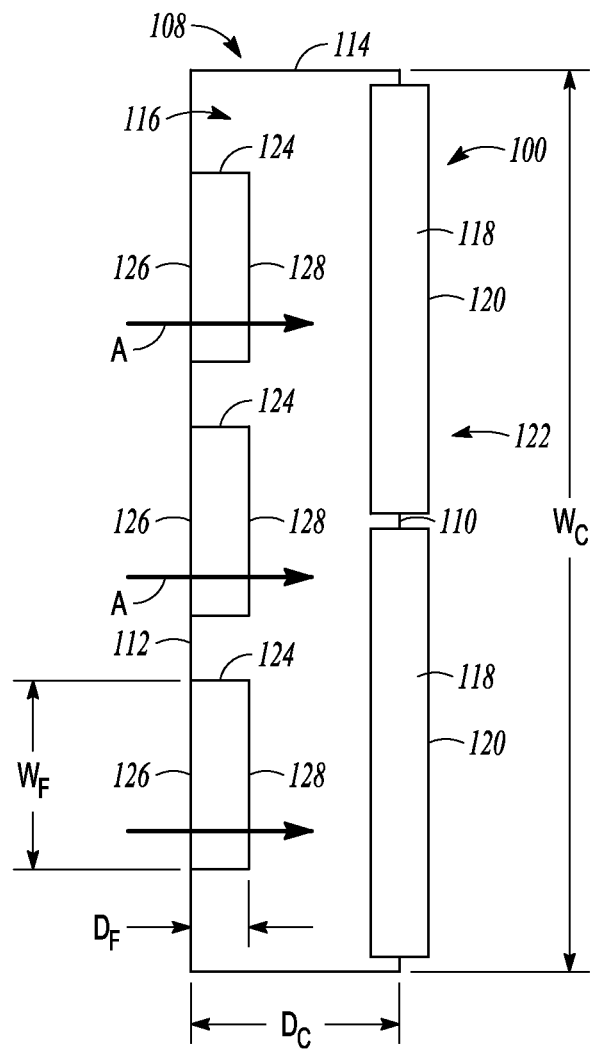
FIG. 3 is a cross-sectional top view of the example sign structure shown in FIG. 2.

FIGS. 2-5 show various examples of electronic display enclosure assemblies that can be used to provide a ventilated electronic display sign in a sign structure, similar to the electronic display sign 10 within the sign structure 2 shown in FIG. 1. FIGS. 2 and 3 show a first example electronic display enclosure assembly 100 that can be used within a sign structure 102. One or more display enclosure assemblies 100 can be mounted in the sign structure 102 to form an electronics sign 103. For example, as shown in FIG. 2, the sign 103 can include a first display enclosure assembly 100 on a first side of the sign structure 102 and a second display enclosure assembly 100 on a second side of the sign structure 102. Alternatively, an electronic sign can include only one display enclosure assembly 100 mounted in a sign structure. The one or more display enclosure assemblies 100 and the sign structure 102 can enclose an interior space 104 within the sign structure, also referred to herein as a sign interior space 104, so that the sign interior space 104 is somewhat isolated from the exterior 106 of the sign.

Each display enclosure assembly 100 can include a cabinet 108 that can be mounted within the sign structure 102. The cabinet 108 of each display enclosure assembly 100 can include a front wall 110, a rear wall 112, and one or more side walls 114 (which can include top and bottom walls) extending between the front wall 110 and the rear wall 112. The front wall 110, the rear wall 112, and the one or more side walls 114 can define an interior space 116 of the cabinet 108, also referred to herein as a cabinet interior space 116. The display enclosure assembly 100 can include one or more display modules 118 that can be at least partially enclosed by the cabinet 108 within the interior space 116. The cabinet 108 can also enclose some or all of the supporting electronics for the operation of the display modules 118, such as power devices, controllers, and LED drivers.

Each of the one or more display modules 118 can comprise a front face 120 within which an array of LEDs or other light-emitting elements can be mounted and made visible (not shown in FIGS. 2 and 3). The display modules 118 can be placed into the cabinet 108 in close proximity to one another so that the front faces 120 of the display modules 118 form a substantially continuous front display surface to form an overall electronic display 122 that is located proximate to or at the front wall 110 of the cabinet 108.

The cabinet 108 can have a height $H_C$ that extends in a first direction, wherein the first direction is substantially parallel to the front wall 110 (e.g., up and down in FIG. 2). The cabinet 108 can also have a width $W_C$ that extends in a second direction, wherein the second direction can also be substantially parallel to the front wall 110 and perpendicular to the first direction (e.g., the second direction can be up and down in FIG. 3). The cabinet 108 can also have a depth $D_C$ that extends in a third direction that is normal to the front wall 110 of the cabinet 108 (e.g., the third direction can be left to right in FIG. 2 and FIG. 3). The height $H_C$, the width $W_C$, and the depth $D_C$ can be minimal relative to the size of the sign structure 102. In particular, the depth $D_C$ can be relatively small, for example to ensure that two display enclosure assemblies 100 can fit within the existing sign structure 102 (e.g., back to back as shown in FIGS. 2 and 3) and still be aesthetically appealing. In an example, the depth $D_C$ can be about 6 inches (about 15 centimeters (cm)) or less, such as about 5 inches (about 13 cm) or less, for example about 3.5 inches (about 9 cm) or less.

The display enclosure assembly 100 can also include structures to provide for ventilation and cooling of the display modules 118. For example, the display enclosure assembly 100 can include one or more fans 124 mounted to the rear wall 112 of the cabinet 108. Each fan 124 can include a fan intake 126 through which air can be fed into the fan 124 and a fan exhaust 128 through which air is ejected. Each of the one or more fans 124 can be mounted so that the fan intake 126 is facing away from the cabinet 108 and so that the fan exhaust 128 is facing inward into the cabinet interior space 116 so that the ejected air can flow past the display modules 118 and supporting electronics to cool the display enclosure assembly 100.

Each fan 124 has a height $H_F$ in the first direction, a width $W_F$ in the second direction, and a depth $D_F$ in the third direction. The dimensions of the fan 124, and in particular the fan height $H_F$ and the fan width $W_F$, can be a factor in the maximum air flow rate that the fan 124 can achieve, and thus the maximum cooling capacity that the fan 124 can provide. Therefore, the dimensions of the fan 124, and in particular the fan height $H_F$ and the fan width $W_F$ can have a minimum specification for the particular display enclosure assembly 100, for example based on the number of display modules 118 and supporting electronics therein. In an example, the fan 124 can have a height $H_F$ and a width $W_F$ that is at least about 80 mm, for example at least about 100 mm, such as at least about 120 mm.

Generally, when providing for ventilation within an electronic display, it can be desirable to orient a ventilation fan so that the air flow out of the fan is generally parallel to the intended direction of air flow, which, in this case, is along a face to be cooled. For example, when cooling a vertically oriented display module 118, the cooling air flow would generally flow vertically or horizontally across a face of the display module 118, rather than into the module. However, as noted above, the depth $D_C$ of the cabinet 108 can be relatively small, for example so that two display enclosure assemblies 100 can fit within an existing sign structure 102. The small cabinet depth $D_C$ can often be smaller than the minimum fan height $H_F$ and fan width $W_F$ of the fans 124 desired for the display enclosure assembly 100. In such a scenario, the cabinet 108 can be too shallow to accommodate mounting the one or more fans 124 horizontally along one of the sides 114 (which would be desirable so that air flow coming out of the fan 124 would be travelling along the rear faces of the display modules 118). As such, the one or more fans 124 of the display enclosure assembly 100 can be mounted at the rear wall 112 of the cabinet 108 because the rear wall 112 can have a height $H_C$ that can be larger than the fan height $H_F$ and a width $W_C$ that can be larger than the fan width $W_F$ so that the one or more fans 124 can be mounted to the cabinet 108 without interfering with other components of the display enclosure assembly 100. As will be understood by a person of ordinary skill in the art, the cabinet depth $D_C$ can actually have a value that is larger than the fan height $H_F$ and the fan width $W_F$, but that would still be too small to accommodate mounting a fan 124 to a side 114 because the cabinet 108 also includes other components, most notably the display modules 118, which can extend into the cabinet interior space 116 such that they would interfere with proper mounting of the fan 124.

Moving the mounting location of a fan 124 from one of the sides 114 to the rear wall 112 would, by itself, be a relatively simple task. However, for an enclosed assembly such as the display enclosure assembly 100, rear mounting of the one or more fans 124 can result in another challenge. Specifically, ensuring a supply of cooling air to the fan intake 126 which is located inside the sign interior space 104 that is enclosed by the sign structure 102 and the one or more cabinets 108 of the one or more display enclosure assemblies 100. Therefore, the display enclosure assembly 100 of the present disclosure can include features that provide a pathway for cooling air to flow from the exterior 106 of the sign structure 102 into the sign interior space 104. In particular, the display enclosure assembly 100 can be configured to provide an intake pathway 130 for cooling air to flow from the sign exterior 106 into the sign interior space 104 so that the cooling air can be drawn by a fan 124 through the fan intake 126. The display enclosure assembly 100 can also be configured to provide an exhaust pathway 132 for warmed air to flow from within the cabinet interior space 116 out to the sign exterior 106. In an example, the intake pathway 130 can be located at or proximate to a bottom edge of the cabinet 108, e.g., so that the cooling air can enter the sign interior space 104 and the cabinet interior space 116 generally at the bottom of the sign, and the exhaust pathway 132 can be located proximate to an upper edge of the cabinet 108, e.g., so that the warmed air can exit the cabinet 108 generally at the top of the sign. The bottom entry of the cooling air and the top exhaust can provide for more efficient air flow because the convective nature of warmed air can be used to assist the one of more fans 124 in moving the air through the cabinet 108. Similarly, the one or more fans 124 can be mounted proximate to a bottom edge of the rear wall 112 to draw the cooling air from the bottom of the sign interior space 104 into the cabinet 108 proximate to the bottom of the cabinet interior space 116. The cooling air can then flow generally upward through the cabinet interior space 116 before exiting out the exhaust pathway 132.

FIG. 2 shows a side cross-sectional view of a display enclosure assembly 100 that provides a first example of an intake pathway 130 to provide for cooling air flow from the sign exterior 106 into the sign interior space 104 and of an exhaust pathway 132 that provides an exit for warmed air from the cabinet interior space 116 out to the sign exterior 106. The intake pathway 130 can be defined by a vent 134 that can extend from proximate the front wall 110 of the cabinet 108 to proximate the rear wall 112 of the cabinet 108. In the example shown in FIG. 2, the vent 134 can be positioned at one of the sides 114 of the cabinet 108 so that the vent 134 forms a plenum that extends from proximate the front wall 110 to the rear wall 112 of the cabinet 108. As the one or more fans 124 blow, they can create an increased air pressure within the cabinet interior space 116 to create a cooling air flow A through the one or more fans 124 and across the display modules 118 and that can eventually force the warmed air out of the interior space 116 through the exhaust pathway 132. The one or more fans 124 can also create a decreased air pressure within the sign interior space 104, which can act to draw fresh cooling air through the intake pathway 130 and into the sign interior space 104.

The vent 134 can include a vent inlet 136 that is exposed to the sign exterior 106 and a vent outlet 138 that leads into the sign interior space 104. In the example shown in FIG. 2, the vent inlet 136 can be formed from one or more openings oriented substantially normal to the front wall 110. In an example, the vent inlet 136 is located along a bottom edge of the cabinet 108 so that the air flow A must enter the vent 134 generally vertically upward through the bottom of the cabinet 108. Generally vertical entry of the air flow A can be preferable because the vent inlet 136 can be a potential entry point for water to get into the sign structure 102 and it is less likely that water will be able to enter the vent 134 while travelling upward and if it does, it is less likely the water will be able to pass through the vent 134 into the sign interior space 104 where the water could potentially come into contact with electrical wiring or components. The vent outlet 138 can be formed from one or more openings in the rear wall 112 of the cabinet 108, as shown in FIG. 2. The vent 134 can also include one or more other structures to prevent or reduce the ingress of water into the sign interior space 104, such as a screen, a filter, or an array of openings at the vent inlet 136 or the vent outlet 138, or both. The screen or array of openings can provide resistance for water entry into the vent 134 or into the sign interior space 104 while still allowing for free passage of the cooling air flow A.

The exhaust pathway 132 can be defined by an exhaust 140 that passes from the cabinet interior space 116 to the sign exterior 106. The exhaust 140 can be located proximate to a top edge of the cabinet 108, as best shown in FIG. 2. The exhaust 140 can include an exhaust inlet 142 that is in fluid communication with the cabinet interior space 116 and an exhaust outlet 144 that faces the sign exterior 106. In an example, the exhaust outlet 144 can be positioned on the front wall 110 of the cabinet 108, such as along a top edge of the front wall 110.

Like the vent 134, the exhaust 140 can include one or more structures configured to limit the ingress of water into the cabinet interior space 116, such as environmental water (e.g., rain) or wash water from a sprayer. In the example shown in FIG. 2, the exhaust 140 can include a front lip 146 at or proximate to the exhaust outlet 144 and a rear lip 148 at or proximate to the exhaust inlet 142. The front lip 146 and the rear lip 148 can extend into the exhaust 140 (e.g., into the exhaust pathway 132) from different directions, such as in opposite directions, to provide a tortuous pathway for water to enter the cabinet 108 through the exhaust 140. For example, the front lip 146 can extends downwardly from the top of the exhaust 140 at or near a front end of the exhaust 140, e.g., proximate the front wall 110, and the rear lip 148 can extend upwardly from the bottom of the exhaust 140 proximate to a rear end of the exhaust 140, e.g., proximate to a back face of a display module 118 proximate to the exhaust 140. The front lip 146 can reduce the exposed area of the exhaust 140 in order to reduce the area through which water can enter the exhaust 140. The front lip 146 can also direct any water that does enter the exhaust 140 toward the bottom of the exhaust 140, where the flow of the water can be interrupted by the rear lip 148. The rear lip 148 can, therefore, prevent the water from flowing into the cabinet interior space 116. If water does get into the exhaust 140 through the exhaust outlet 144, the water can simply be flowed back out of the exhaust 140 through the exhaust outlet 144.

As shown in FIG. 2, the display enclosure assembly 100 can be configured so that cooling air enters the vent inlet 136 from the sign exterior 106 at a bottom edge of the cabinet 108, such as on a bottom side 114 of the cabinet 108. The cooling air can pass through the vent 134 and pass through the vent outlet 138 into the sign interior space 104. The cooling air can be drawn from the sign exterior 106 through the vent 134 and into the sign interior space 104 by the one or more fans 124. The one or more fans 124 in turn can blow the cooling air into the cabinet interior space 116, where the cooling air flows across rear faces of the one or more display modules 118 to cool the electronics of the electronic display 122. The electronics can, in turn, warm the cooling air. Continued blowing from the one or more fans 124 can force the warmed air through the exhaust inlet 142 into the exhaust 140. The warmed air can further be forced through the exhaust outlet 144 out to the sign exterior 106.

Figure 4:
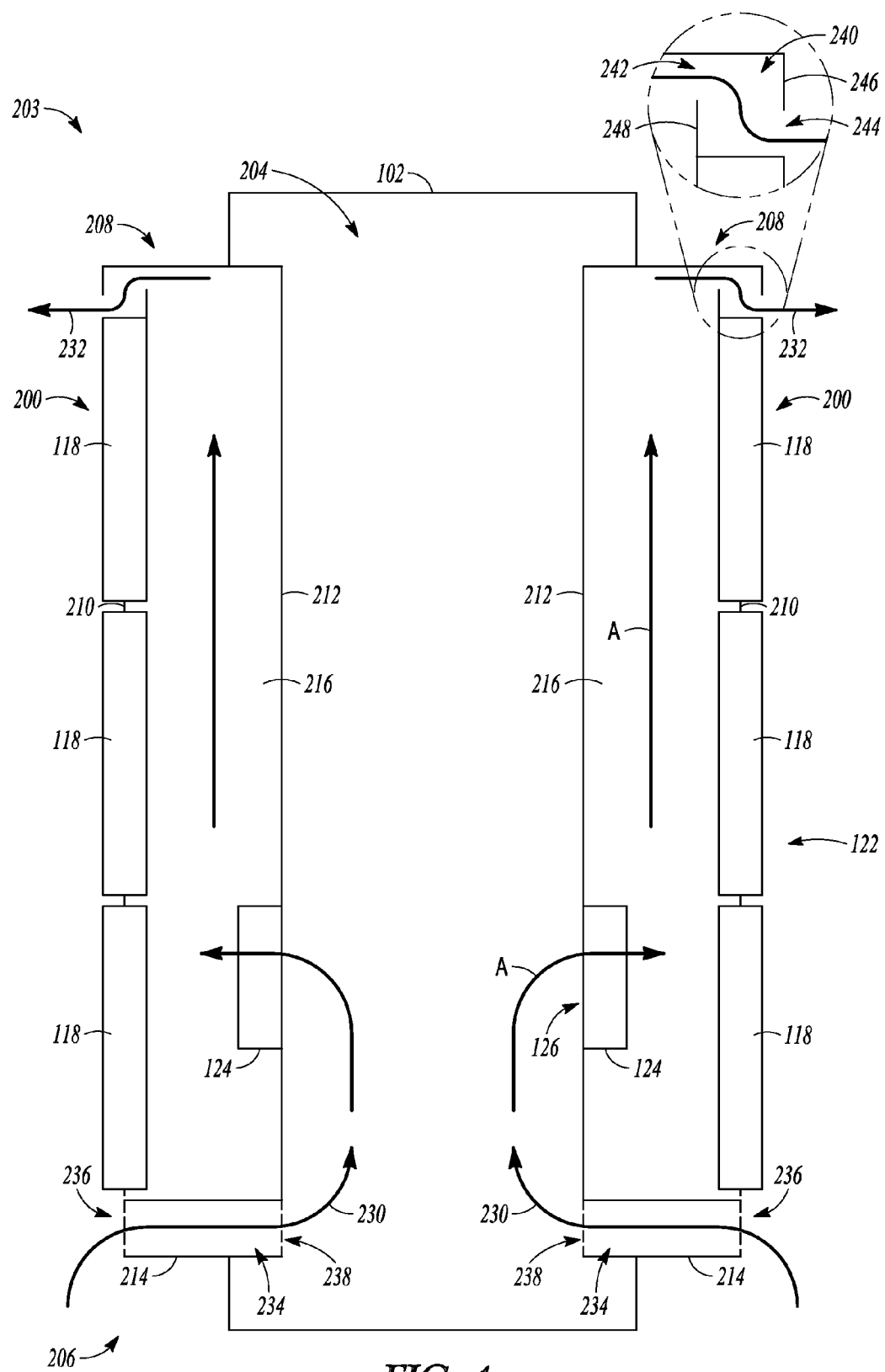
FIG. 4 is a cross-sectional side view of an example sign structure showing a second example ventilation configuration.

FIG. 4 shows another example display enclosure assembly 200 that provides for an alternative example intake pathway 230. The display enclosure assembly 200 of FIG. 4 is similar to the display enclosure assembly 100 of FIGS. 2 and 3 in many respects, and similar or identical reference numbers are used below when referring to similar or identical aspects of the display enclosure assembly 200 when compared to the display enclosure assembly 100. As with the display enclosure assembly 100 of FIGS. 2 and 3, one or more of the example display enclosure assembly 200 can be mounted in a sign structure 102 to form an electronic sign 203. The one or more display enclosure assemblies 200 and the sign structure 102 can enclose a sign interior space 204 so that the sign interior space 204 is somewhat isolated from the exterior 206 of the sign 203.

Each display enclosure assembly 200 can include a cabinet 208 that can be mounted within the sign structure 102. The cabinet 208 can include a front wall 210, a rear wall 212, and one or more sides 214 extending between the front wall 210 and the rear wall 212. The front wall 210, the rear wall 212, and the one or more sides 214 can define a cabinet interior space 216. The display enclosure assembly 200 can include one or more display modules 118 and other supporting electronics that can be at least partially enclosed by the cabinet 208 within the cabinet interior space 216.

The display enclosure assembly 200 can also include an intake pathway 230 for cooling air to flow from the sign exterior 206 into the sign interior space 204 and an exhaust pathway 232 for warmed air to flow from within the cabinet interior space 216 out to the sign exterior 206. The example intake pathway 230 of the display enclosure assembly 200 is similar to the intake pathway 130 of the display enclosure assembly 100, e.g., by being located proximate to a bottom edge of the cabinet 208, but the intake pathway 230 can also be slightly different.

The intake pathway 230 can be defined by a vent 234 having a vent inlet 236 and a vent outlet 238. The vent inlet 236 can be located in the front wall 210 of the cabinet 208, in contrast to the vent inlet 136 of the display enclosure assembly 200 that is located along a bottom side 114 of the cabinet 108 (as shown in FIG. 2). Therefore, the air path through the intake pathway 230 can be substantially straight through the vent 234 from the front wall 210 to the rear wall 212 of the cabinet, rather than being slightly serpentine upward from the bottom side 114 toward the rear wall 112 as in the display enclosure assembly 100 of FIG. 2.

As shown in FIG. 4, the exhaust pathway 232 can be substantially identical to the exhaust pathway 132 in FIG. 2 (e.g., being defined by an exhaust 240 with an exhaust inlet 242 proximate a rear face of the display modules 118, an exhaust outlet 244 proximate to the front wall 210 of the cabinet 208, and a front lip 246 and a rear lip 248 configured to prevent or impede the ingress of water into the cabinet 208).

Figure 5:
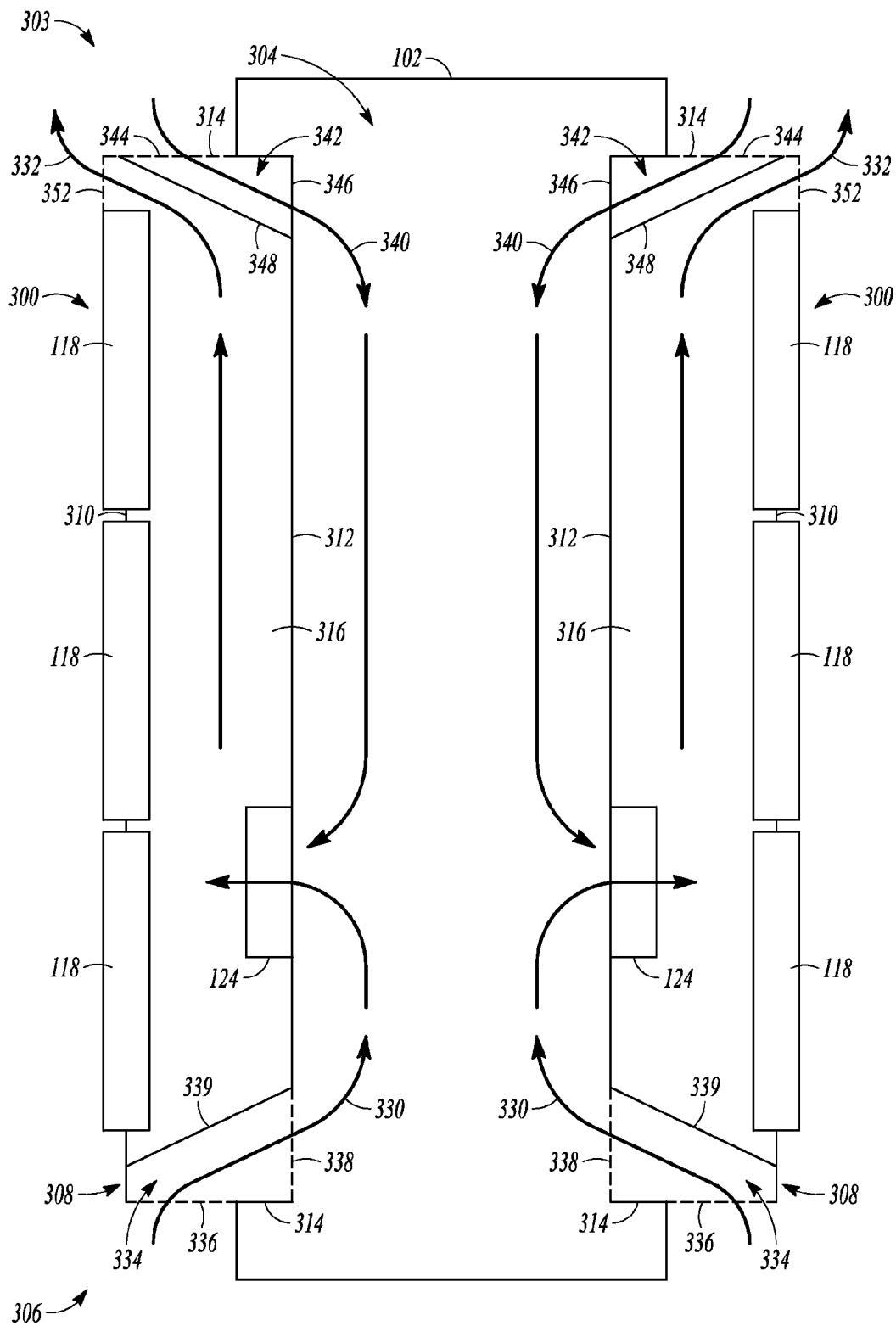
FIG. 5 is a cross-sectional side view of an example sign structure showing a third example ventilation configuration.

FIG. 5 shows another example display enclosure assembly 300 that provides for yet another alternative example intake pathway 330, 340 and an alternative exhaust pathway 332. The display enclosure assembly 300 of FIG. 5 is similar to the display enclosure assembly 100 of FIGS. 2 and 3 and the display enclosure assembly 200 of FIG. 4 in many respects, and similar or identical reference numbers are used below when referring to similar or identical aspects of the display enclosure assembly 300 when compared to the display enclosure assemblies 100 and 200. As with the display enclosure assemblies 100 and 200, one or more of the example display enclosure assembly 300 can be mounted in a sign structure 102 to form an electronic sign 303. The one or more display enclosure assemblies 300 and the sign structure 102 can enclose a sign interior space 304 so that the sign interior space 304 is somewhat isolated from the exterior 306 of the sign 303.

Each display enclosure assembly 300 can include a cabinet 308 that can be mounted within the sign structure 102. The cabinet 308 can include a front wall 310, a rear wall 312, and one or more sides 314 extending between the front wall 310 and the rear wall 312. The front wall 310, the rear wall 312, and the one or more sides 314 can define a cabinet interior space 316. The display enclosure assembly 300 can include one or more display modules 118 and other supporting electronics that can be at least partially enclosed by the cabinet 308 within the cabinet interior space 316.

The display enclosure assembly 300 can also include an intake pathway 330 for cooling air to flow from the sign exterior 306 into the sign interior space 304 and an exhaust pathway 332 for warmed air to flow from within the cabinet interior space 316 out to the sign exterior 306. The example intake pathway 330 of the display enclosure assembly 300 can be located proximate to a bottom edge of the cabinet 308. The intake pathway 330 can be defined by a vent 334 having a vent inlet 336 and a vent outlet 338. Like the intake pathway 130 of display enclosure assembly 100, the intake pathway 330 can be located along a bottom side 314 of the cabinet 308 so that the flow path of cooling air can be directed upward from a bottom of the cabinet 308. As shown in FIG. 5, in an example, the vent 334 can comprise a beveled wall 339 that forms an angle with respect to horizontal so that the vent 334 is generally wedge shaped rather than the generally rectilinear vents 134, 234 shown in FIGS. 2 and 4.

As shown in FIG. 5, the display enclosure assembly 300 can also include a second intake pathway 340 at the upper end of the cabinet 308. The second intake pathway 340 can be similar to the first intake pathway 330. For example, the second intake pathway 340 can be defined by a vent 342 having a vent inlet 344 through which cooling air can pass from the sign exterior 306 and a vent outlet 346 through which the cooling air can pass to reach the sign interior space 304. The vent inlet 344 can be located on an upper side 314 of the cabinet, similar the vent inlet 336 of the first vent 334 being located on a lower side 314. The vent 342 of the second intake pathway 340 can include a beveled wall 348 (similar to the beveled wall 339 of the first intake pathway 330) so that the vent 342 is generally wedge shaped, similar to the vent 334 of the first intake pathway 330.

Because of the presence of the second intake pathway 340 at the top edge of the cabinet 308, the exhaust pathway 332 can be more simplified compared to the exhaust pathways 132, 232 in FIGS. 2 and 4. In the example shown in FIG. 5, the exhaust pathway 332 can simply comprise one or more openings 352 through the front wall 310 or through the top side 314. The warmed air can be directed by the beveled wall 348 toward the opening 352.

Other forms of intake pathways and exhaust pathways can also be envisioned without varying from the scope of the present invention. For example, one or both of the pathways can be located on a side edge of the display enclosure assembly cabinet rather than on the top edge or the bottom edge, as described in the examples above. The intake pathway and the exhaust pathway can also be configured to be located on the same side of the display enclosure assembly (e.g., similar to the second intake pathway 340 and the exhaust pathway 350 shown in FIG. 5).

To better illustrate the present display enclosure assembly and system of the present disclosure, a non-limiting list of Examples is provided here:

EXAMPLE 1 can include subject matter (such as an apparatus, a device, a method, or one or more means for performing acts), such as can include a display enclosure assembly. The subject matter can include a cabinet comprising a front wall, a rear wall, and one or more sides extending between the front wall and the rear wall, the cabinet defining an interior space, one or more display modules at least partially enclosed within the interior space of the cabinet, the one or more display modules configured to form an electronic display at the front wall of the cabinet, one or more fans mounted at the rear wall of the cabinet, each of the one or more fans comprising a fan intake facing rearward from the rear wall and a fan exhaust facing into the interior space, a vent extending from proximate the front wall to proximate the rear wall, the vent providing a first pathway for cooling air to pass from a front side of the cabinet to the rear side of the cabinet, and an exhaust providing a second pathway for warmed air to exit the interior space.

EXAMPLE 2 can include, or can optionally be combined with the subject matter of EXAMPLE 1, to optionally include the cabinet having a cabinet height in a first direction extending substantially parallel to the front wall, a cabinet width in a second direction extending substantially parallel to the front wall, and a cabinet depth in a third direction that is substantially normal to the front wall.

EXAMPLE 3 can include, or can optionally be combined with the subject matter of either one of EXAMPLES 1 or 2, to optionally include each fan having a fan height in the first direction, a fan width in the second direction, and a fan depth in the third direction, wherein the fan height and the fan width are approximately equal to or greater than the cabinet depth.

EXAMPLE 4 can include, or can optionally be combined with the subject matter of one or any combination of EXAMPLES 1-3, to optionally include the vent comprising a vent inlet through one of the one or more sides of the cabinet.

EXAMPLE 5 can include, or can optionally be combined with the subject matter of one or any combination of EXAMPLES 1-4, to optionally include the vent comprising a vent inlet through the front wall of the cabinet.

EXAMPLE 6 can include, or can optionally be combined with the subject matter of one or any combination of EXAMPLES 1-5, to optionally include the vent comprising a vent outlet through the rear wall.

EXAMPLE 7 can include, or can optionally be combined with the subject matter of one or any combination of EXAMPLES 1-6, to optionally include the vent being located along a bottom edge of the cabinet.

EXAMPLE 8 can include, or can optionally be combined with the subject matter of one or any combination of EXAMPLES 1-7, to optionally include the exhaust comprising an exhaust inlet from the interior space of the cabinet.

EXAMPLE 9 can include, or can optionally be combined with the subject matter of one or any combination of EXAMPLES 1-8, to optionally include the exhaust comprising an exhaust outlet through the front wall of the cabinet.

EXAMPLE 10 can include, or can optionally be combined with the subject matter of one or any combination of EXAMPLES 1-9, to optionally include the exhaust comprising a first lip at the exhaust inlet.

EXAMPLE 11 can include, or can optionally be combined with the subject matter of one or any combination of EXAMPLES 1-10, to optionally include the exhaust comprising a second lip at the exhaust outlet.

EXAMPLE 12 can include, or can optionally be combined with the subject matter of one or any combination of EXAMPLES 1-11, to optionally include the one or more fans being mounted to be substantially parallel to the rear wall of the cabinet.

EXAMPLE 13 can include, or can optionally be combined with the subject matter of one or any combination of EXAMPLES 1-12, to include subject matter (such as an apparatus, a device, a method, or one or more means for performing acts), such as can include an electronic sign. The subject matter can comprise a sign structure, one or more display enclosure assemblies mounted in the sign structure, wherein the sign structure and the one or more display enclosure assemblies define a sign exterior and a sign interior space, each of the one or more display enclosure assemblies comprising, a cabinet comprising a front wall, a rear wall, and one or more sides extending between the front wall and the rear wall, the cabinet defining a cabinet interior space, one or more display modules at least partially enclosed within the cabinet interior space, the one or more display modules configured to form an electronic display at the front wall of the cabinet, one or more fans mounted at the rear wall of the cabinet, each of the one or more fans comprising a fan intake facing rearward into the sign interior space and a fan exhaust facing into the cabinet interior space, a vent extending from proximate the front wall to proximate the rear wall, the vent providing a first pathway for cooling air to pass from the sign exterior to the sign interior, and an exhaust providing a second pathway for warmed air to pass from the cabinet interior space to the sign exterior.

EXAMPLE 14 can include, or can optionally be combined with the subject matter of one or any combination of EXAMPLES 1-13, to optionally include the cabinet having a cabinet height in a first direction extending substantially parallel to the front wall, a cabinet width in a second direction extending substantially parallel to the front wall, and a cabinet depth in a third direction that is substantially normal to the front wall.

EXAMPLE 15 can include, or can optionally be combined with the subject matter of one or any combination of EXAMPLES 1-14, to optionally include each fan having a fan height in the first direction, a fan width in the second direction, and a fan depth in the third direction, wherein the fan height and the fan width are approximately equal to or greater than the cabinet depth.

EXAMPLE 16 can include, or can optionally be combined with the subject matter of one or any combination of EXAMPLES 1-15, to optionally include the vent comprising a vent inlet through one of the one or more sides of the cabinet.

EXAMPLE 17 can include, or can optionally be combined with the subject matter of one or any combination of EXAMPLES 1-16, to optionally include the vent comprising a vent inlet through the front wall.

EXAMPLE 18 can include, or can optionally be combined with the subject matter of one or any combination of EXAMPLES 1-17, to optionally include the vent comprising a vent outlet through the rear wall.

EXAMPLE 19 can include, or can optionally be combined with the subject matter of one or any combination of EXAMPLES 1-18, to optionally include the vent being located along a bottom edge of the cabinet.

EXAMPLE 20 can include, or can optionally be combined with the subject matter of one or any combination of EXAMPLES 1-19, to optionally include the exhaust comprising an exhaust inlet from the interior space of the cabinet.

EXAMPLE 21 can include, or can optionally be combined with the subject matter of one or any combination of EXAMPLES 1-20, to optionally include the exhaust comprising an exhaust outlet through the front wall of the cabinet.

EXAMPLE 22 can include, or can optionally be combined with the subject matter of one or any combination of EXAMPLES 1-21, to optionally include the exhaust comprising a first lip at the exhaust inlet.

EXAMPLE 23 can include, or can optionally be combined with the subject matter of one or any combination of EXAMPLES 1-22, to optionally include the exhaust comprising a second lip at the exhaust outlet.

EXAMPLE 24 can include, or can optionally be combined with the subject matter of one or any combination of EXAMPLES 1-23, to include subject matter (such as an apparatus, a device, a method, or one or more means for performing acts), such as a method. The subject matter can comprise providing or receiving one or more display enclosure assemblies each comprising a cabinet comprising a front wall, a rear wall, and one or more sides extending between the front wall and the rear wall, the cabinet defining a cabinet interior space, one or more display modules at least partially enclosed within the cabinet interior space, the one or more display modules configured to form an electronic display at the front wall of the cabinet, one or more fans mounted at the rear wall of the cabinet, each of the one or more fans comprising a fan intake facing rearward into the sign interior space and a fan exhaust facing into the cabinet interior space, a vent extending from proximate the front wall to proximate the rear wall, and an exhaust in fluid communication with the cabinet interior space. The subject matter can further include mounting the one or more display enclosure assemblies in a sign structure so that the sign structure and the one or more display enclosure assemblies define a sign exterior and a sign interior space and so that the vent provides a first pathway for cooling air to pass from the sign exterior to the sign interior and so that the exhaust provides a second pathway for warmed air to pass from the cabinet interior space to the sign exterior.

EXAMPLE 25 can include, or can optionally be combined with the subject matter of one or any combination of EXAMPLES 1-24, to optionally include the cabinet having a cabinet height in a first direction extending substantially parallel to the front wall, a cabinet width in a second direction extending substantially parallel to the front wall, and a cabinet depth in a third direction that is substantially normal to the front wall.

EXAMPLE 26 can include, or can optionally be combined with the subject matter of one or any combination of EXAMPLES 1-25, to optionally include each fan having a fan height in the first direction, a fan width in the second direction, and a fan thickness in the third direction, wherein the fan height and the fan width are approximately equal to or greater than the cabinet thickness.

EXAMPLE 27 can include, or can optionally be combined with the subject matter of one or any combination of EXAMPLES 1-26, to optionally include flowing cooling air from the sign exterior through the vent into the sign interior space.

EXAMPLE 28 can include, or can optionally be combined with the subject matter of one or any combination of EXAMPLES 1-27, to optionally include flowing the cooling air through the one or more fans into the cabinet interior space so that the cooling air can cool electronics in the cabinet interior space and provide warmed air.

EXAMPLE 29 can include, or can optionally be combined with the subject matter of one or any combination of EXAMPLES 1-28, to optionally include flowing the warmed air from the cabinet interior space through the exhaust to the sign exterior.

The above Detailed Description is intended to be illustrative, and not restrictive. For example, the above-described examples (or one or more elements thereof) can be used in combination with each other. Other embodiments can be used, such as by one of ordinary skill in the art upon reviewing the above description. Also, various features or elements can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented, at least in part. Some examples can include a computer-readable medium or machine-readable medium encoded with instructions operable to configure an electronic device to perform methods or method steps as described in the above examples. An implementation of such methods or method steps can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Although the invention has been described with reference to exemplary embodiments, workers skilled in the art will recognize that changes may be made in form and detail without departing from the spirit and scope of the invention.

What is claimed is:

1. A display enclosure assembly comprising:
   a cabinet enclosing an interior space, the cabinet comprising a front wall and a rear wall;

one or more display modules at least partially enclosed within the interior space, wherein each of the one or more display modules comprises a front face, and wherein the one or more front faces of the one or more display modules cooperate to form an electronic display along the front wall;

one or more fans mounted at the rear wall, each of the one or more fans comprising a fan intake facing rearward from the rear wall and a fan exhaust facing into the interior space;

a vent comprising a plenum extending through the cabinet from a front exterior side in front of the front wall to a rear exterior side behind the rear wall, the vent providing a first pathway for cooling air to pass from the front exterior side, through the plenum, to the rear exterior side so that the cooling air can be drawn into interior space by the one or more fans; and an exhaust providing a second pathway for warmed air to exit the interior space.

2. The display enclosure assembly of claim 1, wherein:

the cabinet has a cabinet height in a first direction extending substantially parallel to the front wall, a cabinet width in a second direction extending substantially parallel to the front wall, and a cabinet depth in a third direction that is substantially normal to the front wall; and each fan has a fan height in the first direction, a fan width in the second direction, and a fan depth in the third direction, wherein the fan height and the fan width are approximately equal to or greater than the cabinet depth.

3. The display enclosure assembly of claim 1, wherein the cabinet comprises one or more sides extending at least partially between the front wall and the rear wall, wherein the vent comprises a vent inlet through the one or more sides of the cabinet and a vent outlet through the rear wall.

4. The display enclosure assembly of claim 1, wherein the vent comprises a vent inlet through the front wall and a vent outlet through the rear wall.

5. The display enclosure assembly of claim 1, wherein the vent is located along a bottom edge of the cabinet.

6. The display enclosure assembly of claim 1, wherein the exhaust comprises an exhaust inlet from the interior space of the cabinet and an exhaust outlet through the front wall of the cabinet.

7. The display enclosure assembly of claim 6, wherein the exhaust further comprises a first lip at the exhaust inlet and a second lip at the exhaust outlet.

8. The display enclosure assembly of claim 1, wherein the one or more fans are mounted to be substantially parallel to the rear wall.

9. An electronic sign comprising:

a sign structure; and one or more display enclosure assemblies mounted to the sign structure, wherein the sign structure and the one or more display enclosure assemblies enclose a sign interior space and separate the sign interior space from a sign exterior;

each of the one or more display enclosure assemblies comprising:

a cabinet located at least partially in the sign interior space, the cabinet enclosing a cabinet interior space, and wherein the cabinet comprises a front cabinet wall and a rear cabinet wall;

one or more display modules at least partially enclosed within the cabinet interior space, wherein each of the one or more display modules comprises a front face, wherein the one or more front faces of the one or more display modules cooperate to form an electronic display along the front cabinet wall;

one or more fans mounted at the rear cabinet wall, each of the one or more fans comprising a fan intake facing rearward into the sign interior space and a fan exhaust facing into the cabinet interior space;

a vent comprising a plenum extending through the cabinet between the sign exterior in front of the cabinet to the sign interior space behind the rear cabinet wall, the vent providing a first pathway for cooling air to pass from the sign exterior, through the plenum, and into the sign interior space behind the rear cabinet wall so that the cooling air is available to be drawn into the cabinet interior space by the one or more fans; and an exhaust providing a second pathway for warmed air to pass from the cabinet interior space to the sign exterior.

10. The electronic sign of claim 9, wherein:

the cabinet has a cabinet height in a first direction extending substantially parallel to the front wall, a cabinet width in a second direction extending substantially parallel to the front wall, and a cabinet depth in a third direction that is substantially normal to the front wall; and each fan has a fan height in the first direction, a fan width in the second direction, and a fan depth in the third direction, wherein the fan height and the fan width are approximately equal to or greater than the cabinet depth.

11. The electronic sign of claim 9, wherein the cabinet comprises one or more sides extending at least partially between the front wall and the rear wall, and wherein the vent comprises a vent inlet through one of the one or more sides and a vent outlet through the rear wall.

12. The electronic sign of claim 9, wherein the vent comprises a vent inlet through the front wall and a vent outlet through the rear wall.

13. The electronic sign of claim 9, wherein the vent is located along a bottom edge of the cabinet.

14. The electronic sign of claim 9, wherein the exhaust comprises an exhaust inlet from the cabinet interior space and an exhaust outlet through the front wall of the cabinet.

15. The electronic sign of claim 14, wherein the exhaust further comprises a first lip at the exhaust inlet and a second lip at the exhaust outlet.

16. A method comprising the steps of:

providing or receiving one or more display enclosure assemblies each comprising:

a cabinet enclosing a cabinet interior space, wherein the cabinet comprises a front cabinet wall and a rear cabinet wall;

one or more display modules at least partially enclosed within the cabinet interior space, wherein each of the one or more display modules comprises a front face, wherein the one or more front faces of the one or more displays cooperate to form an electronic display along the front cabinet wall;

one or more fans mounted at the rear cabinet wall, each of the one or more fans comprising a fan intake facing rearward from the rear cabinet wall and a fan exhaust facing into the cabinet interior space;

a vent comprising a plenum extending through the cabinet between a front exterior side in front of the front wall to a rear exterior side behind the rear wall; and an exhaust in fluid communication with the cabinet interior space; the method further including mounting the one or more display enclosure assemblies to a sign structure so that the sign structure and the one or more display enclosure assemblies enclose a sign interior space and separates the sign interior space from a sign exterior, and so that the vent provides a first pathway for cooling air to pass from the sign exterior, through the plenum, and into the sign interior space behind the rear cabinet wall so that the cooling air is available to be drawn into the cabinet interior space from the sign interior space by the one or more fans, and so that the exhaust provides a second pathway for warmed air to pass from the cabinet interior space to the sign exterior.

17. The method of claim 16, wherein:

the cabinet has a cabinet height in a first direction extending substantially parallel to the front wall, a cabinet width in a second direction extending substantially parallel to the front wall, and a cabinet depth in a third direction that is substantially normal to the front wall; and each fan has a fan height in the first direction, a fan width in the second direction, and a fan thickness in the third direction, wherein the fan height and the fan width are approximately equal to or greater than the cabinet thickness.

18. The method of claim 16, further comprising:

flowing cooling air from the sign exterior through the plenum of the vent and into the sign interior space behind the rear cabinet wall;

flowing the cooling air from the sign interior space through the one or more fans into the cabinet interior space so that the cooling air can cool electronics in the cabinet interior space and provide warmed air; and flowing the warmed air from the cabinet interior space through the exhaust to the sign exterior.

* * * * *